United States Patent [19]
Kim

[11] Patent Number: 5,858,872
[45] Date of Patent: Jan. 12, 1999

[54] METAL CONTACT STRUCTURE IN SEMICONDUCTOR DEVICE, AND A METHOD OF FORMING THE SAME

[75] Inventor: Hyun Sook Kim, Busan-si, Rep. of Korea

[73] Assignee: LG Semicon Co., Ltd., Chungcheongbuk-do, Rep. of Korea

[21] Appl. No.: 511,361

[22] Filed: Aug. 4, 1995

[30]       Foreign Application Priority Data

Oct. 27, 1994 [KR] Rep. of Korea .................. 1994-27615

[51] Int. Cl.⁶ ............................................... H01L 21/4763
[52] U.S. Cl. ............................................. 438/626; 438/638
[58] Field of Search .................................... 437/186, 195, 437/196; 430/311; 438/626, 639, 638, 672

[56]             References Cited

U.S. PATENT DOCUMENTS

| | | | |
|---|---|---|---|
| 4,927,783 | 5/1990 | Arai et al. ................................ | 437/196 |
| 5,084,413 | 1/1992 | Fujita et al. ............................. | 437/196 |
| 5,191,397 | 3/1993 | Yoshida .................................... | 257/347 |
| 5,288,664 | 2/1994 | Mukai ...................................... | 438/626 |
| 5,310,626 | 5/1994 | Fernandes et al. ....................... | 430/311 |
| 5,330,934 | 7/1994 | Shibata et al. .......................... | 438/639 |
| 5,472,900 | 12/1995 | Vu et al. .................................. | 438/639 |
| 5,514,622 | 5/1996 | Bornstein et al. ....................... | 437/195 |
| 5,534,463 | 7/1996 | Lee et al. ................................. | 437/195 |
| 5,604,156 | 2/1997 | Chung et al. ............................ | 437/195 |

FOREIGN PATENT DOCUMENTS

| | | |
|---|---|---|
| 63-204745 | 8/1988 | Japan . |
| 63-269547 | 11/1988 | Japan . |
| 324737 | 2/1991 | Japan . |

*Primary Examiner*—John F. Niebling
*Assistant Examiner*—Michael S. Lebentritt

[57]             ABSTRACT

A process of forming a metal contact portion of a semiconductor device and a structure thereof are disclosed. The process includes the steps of forming an insulating layer on a semiconductor substrate in which a doped junction has been formed, photo-etching the insulating layer to form a contact hole, forming a conductive layer on a surface of the substrate so that the conductive layer contacts the contact portion through the contact hole, and photo-etching the conductive layer to form a conductive projected portion, whereby a metal layer can contact surfaces of the conductive projected portion and the contact portion of the substrate.

22 Claims, 3 Drawing Sheets

METAL CONTACT STRUCTURE IN SEMICONDUCTOR DEVICE, AND A METHOD OF FORMING THE SAME

FIELD OF THE INVENTION

The present invention relates to a process of forming a metal contact portion in a semiconductor device, and the structure thereof.

DESCRIPTION OF THE BACKGROUND ART

In manufacturing a semiconductor device, a metallization process is carried out for intra-device and inter-device electrical connections. This process gives great influence to the yield and reliability of a complicated integrated circuit of a sub-micron scale.

The conventional process of forming a metal contact portion of a semiconductor device is constituted as follows. An insulating layer is formed upon a semiconductor substrate on which a highly doped junction has been formed. Then the insulating layer is photo-etched to form a contact hole in such a manner so that a contact portion of the substrate (to which a metal layer is to be connected) is exposed. Then a metal contact portion is formed in such a manner so that the metal layer contacts the contact portion of the semiconductor substrate at the bottom of the contact hole.

FIGS. 1A–1C are partial sectional views showing the conventional process of forming a metal contact portion in a semiconductor device. Referring to these drawings, the conventional process of forming a metal contact portion of a semiconductor device will be described.

First, as shown in FIG. 1A, an insulating layer 13 is formed upon a semiconductor substrate 11 having a doped junction 12 formed thereon. Then a photoresist is spread on a surface of the insulating layer 13 to form a photoresist layer 14, and a contact portion is formed by performing a masking process.

As shown in FIG. 1B, by using the photoresist layer 14 as a mask, the insulating layer is etched so that the contact portion of the semiconductor device (to which the metal layer is to be connected) is exposed, thereby forming a contact hole 15.

Then the photoresist layer 14 is removed and then, as shown in FIG. 1C, a metal layer 16 is deposited on the entire surface thereof using a sputtering method, so that the metal layer contacts the contact portion of the substrate through the contact hole.

Thereafter, a metal wiring pattern is formed by carrying out a masking process and an etching process on the metal layer 16.

According to this conventional method, however, the size of the contact hole becomes very small for a semiconductor device which is governed by the sub-micron design rule, and therefore, the contact area between the metal and the semiconductor substrate becomes very small. As a result, the contact resistance is increased.

SUMMARY OF THE INVENTION

The present invention is intended to overcome the above described disadvantages of the conventional methods.

Therefore it is an object of the present invention to provide a process of forming a metal contact portion of a semiconductor device, and the structure thereof, in which the contact area between a metal wiring and a contact portion of a semiconductor substrate is increased, so as to reduce electrical resistance and improve electrical characteristics of the semiconductor device.

In achieving the above object, the process of forming a metal contact portion of a semiconductor device according to an embodiment of the present invention includes the steps of forming an insulating layer on a semiconductor substrate in which a doped junction has been formed; photo-etching the insulating layer to form a contact hole so as to expose a contact portion of the doped junction to which a metal layer is to be connected; forming a conductive layer on the entire surface of the substrate so that the conductive layer contacts the contact portion through the contact hole; and photo-etching the conductive layer to form a conductive projected portion, whereby the conductive projected portion having an area smaller than a bottom area of the contact hole is formed within the contact hole. Thus, a metal layer can contact surfaces of the conductive projected portion and the contact portion of the substrate.

The conductive projected portion is composed of polycrystalline silicon in which impurity ions are doped. Such impurity ions are the same type of impurity ions doped in the junction of the semiconductor substrate. Further, the conductive projected portion is formed in the center of the bottom portion of the contact hole.

The structure of the metal contact portion of a semiconductor device according to an embodiment of the present invention includes: a semiconductor substrate with a doped junction formed thereon, the doped junction being connectable to a metal layer; an insulating layer formed on the semiconductor substrate so as to define a contact hole formed at the contact portion of the substrate, the contact portion being the surface of the doped junction; and a conductive projected portion contacting the contact portion of the substrate through the contact hole, the projected portion having a contact area smaller than the area of the contact portion of the substrate.

Furthermore, the conductive projected portion can be composed of polycrystalline silicon, for example, into which impurity ions are doped. Such impurity ions are the same type as the impurity ions in the doped junction of the semiconductor substrate. The conductive projected portion is centered within the contact hole.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above object and other advantages of the present invention will become more apparent by describing in detail the preferred embodiment of the present invention with reference to the attached drawings, which are given by way of illustration only, and thus are not limitative of the present invention, in which.

DESCRIPTION OF THE PREFERRED EMBODIMENTS

FIGS. 2A–2G are partial sectional views of a semiconductor device showing a process of forming a metal contact portion and an examplary structure of the device according to an embodiment of the present invention.

Figure 1A:
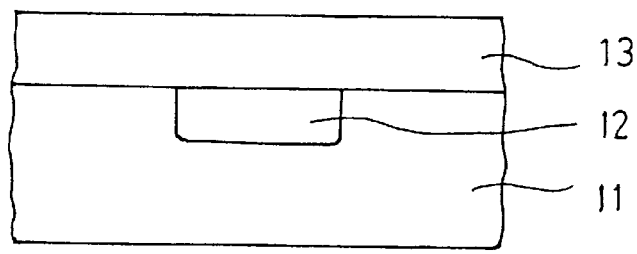
FIGS. 1A, 1B and 1C are partial sectional views of a semiconductor device showing a conventional process of forming a metal contact portion and the structure thereof.
Figure 1B:
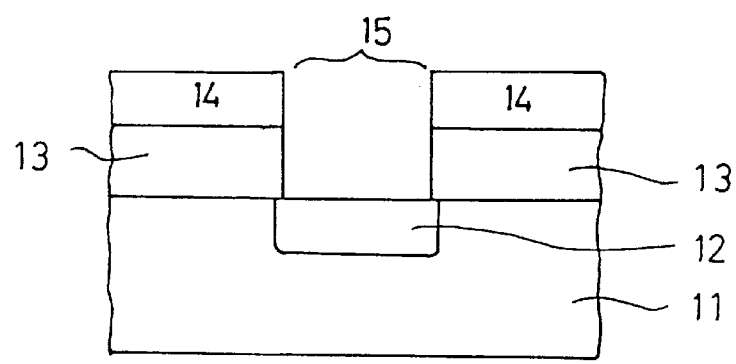
Figure 1C:
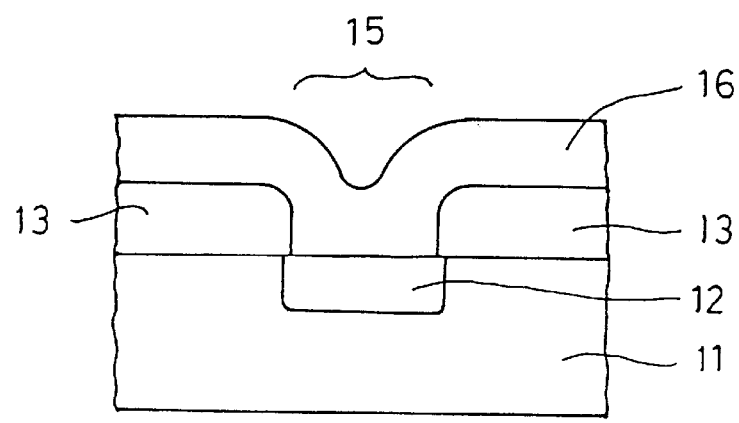
Figure 2A:
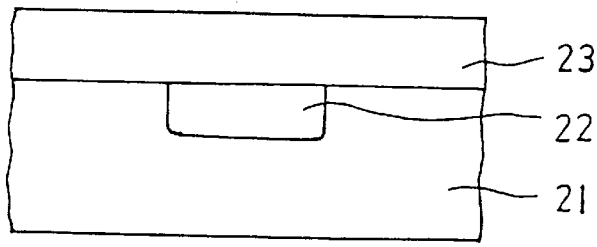
FIGS. 2A–2G are partial sectional views of a semiconductor device showing a process of forming a metal contact portion and the structure thereof, according to an embodiment of the present invention.

As shown in FIG. 2A, an insulating layer 23 is formed upon a semiconductor substrate 21 on which a highly doped junction (impurity area) 22 is formed.

Figure 2B:
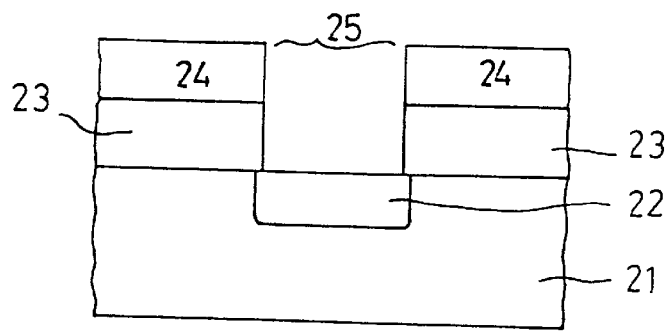

Then a photoresist is coated on a surface of the insulating layer 23 to form a photoresist layer 24, and then, a masking process is carried out to define a metal contact portion. As shown in FIG. 2B, by using the photoresist layer 24 as a mask, the insulating layer 23 is etched to form a contact hole 25, so as to expose a contact portion of the substrate to which a metal layer is to be connected.

Figure 2C:
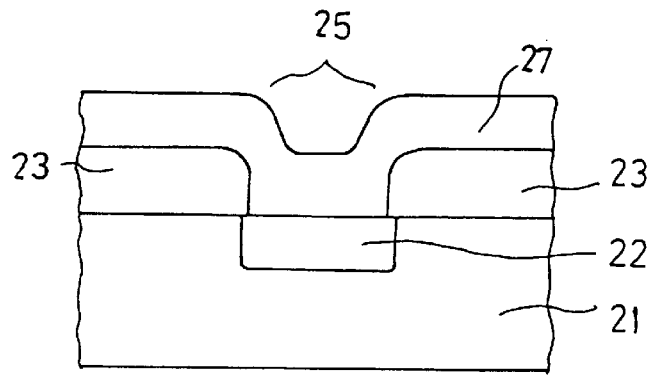

Then as shown in FIG. 2C, a polycrystalline silicon layer 27 is deposited on the entire resulting surface of the semiconductor substrate 21, maintaining the contact hole 25 therewithin.

Figure 2D:
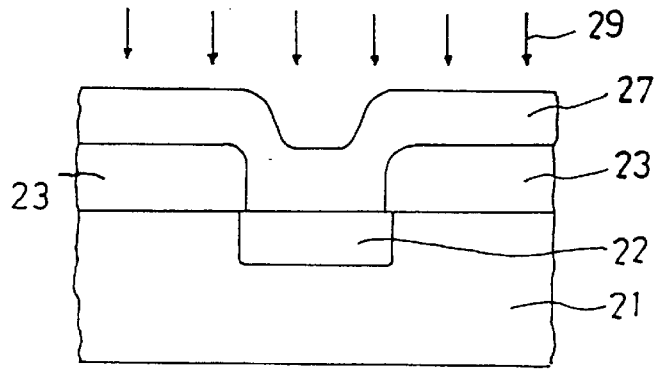

Thereafter, as shown in FIG. 2D, impurity ions 29 of the type same as the type of the impurity ions doped in the junction 22, are ion-implanted into the polycrystalline silicon layer 27. For example, if the impurity area 22 is an N-type, then N-type ions are implanted into the silicon layer 27, whereas if the high doped junction 22 is a P-type, then P-type ions are doped into the silicon layer 27.

Figure 2E:
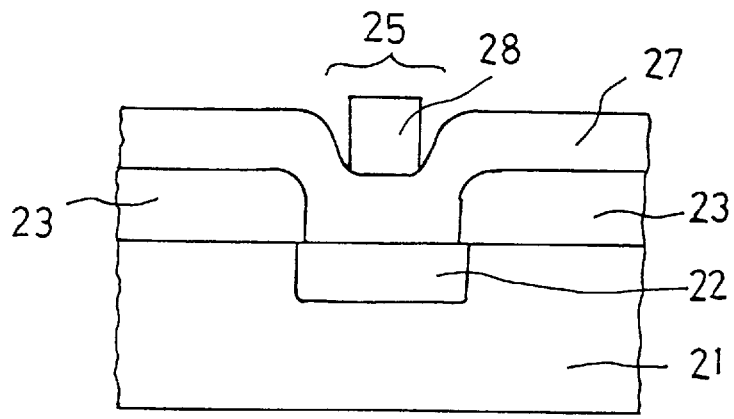

Then, photoresist is coated on the polycrystalline silicon layer 27 to form a photoresist layer 28, and a masking process is carried out to define a conductive projected region. As shown in FIG. 2E, the photoresist layer 28 contacts the silicon layer 27 through a portion of the contact hole.

Figure 2F:
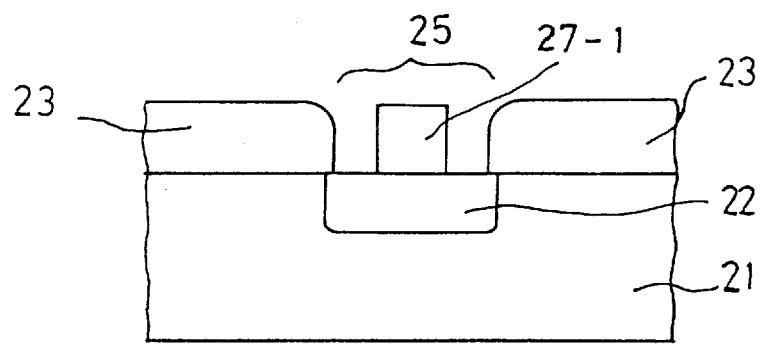

As shown in FIG. 2F, the polycrystalline silicon layer 27 is etched by using the photoresist layer 28 as a mask, thereby forming a conductive projected portion 27-1 which contacts the contact portion of the substrate through the contact hole 25.

The conductive projected portion 27-1 which contacts the contact portion of the substrate 21 through the contact hole 25 is shaped like a cylinder. This cylinder shaped conductive projected portion 27-1 is positioned about the center of the contact hole 25, so that a metal layer can be filled into a space remaining in the contact hole 25. Consequently, the metal layer can contact the contact portion of the substrate 21 through the space surrounding the conductive projected portion 27-1, and can contact the entire surface of the conductive projected portion 27-1. Therefore, the contact area in the semiconductor device can be enlarged.

Figure 2G:
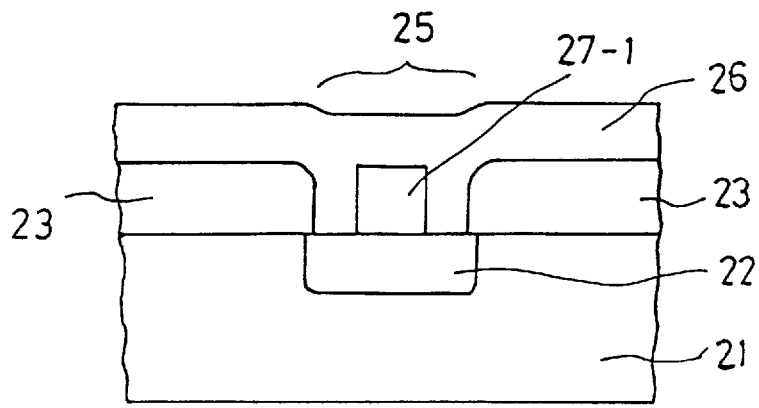

As shown in FIG. 2G, a metal layer 26 is sputtered on the entire resulting surface, so that the metal layer 26 fills the contact hole 25. As a result, the metal layer 26 contacts the contact portion of the substrate 21 around the conductive projected portion 27-1, and the entire surface of the conductive projected portion 27-1.

The subsequent processes are similar to the ones of the conventional methods. For example, a masking process and an etching process are subsequently carried out, thereby forming a metal wiring pattern.

The effects of the present invention are as follows.

The metal contact portion which is manufactured based on the process according to an embodiment of the present invention contacts the contact portion of the substrate at the center of the contact hole. Furthermore, a rod shaped conductive projected portion is formed within the contact hole. Therefore, the metal layer filled into the contact hole contacts the entire surface of the conductive projected portion and the contact portion of the substrate around the conductive projected portion. As a result, the contact area is increased as much as the exposed surface area of the conductive projected portion. Furthermore, the conductive projected portion is composed of polycrystalline silicon, for example. The impurity ions of the type same as the type of the impurity ions in the doped junction of the substrate, are doped into the conductive projected portion. Consequently, contact resistance is minimized and a semiconductor device of a sub-micron scale with superior electrical characteristics is provided.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A process of forming a metal contact portion of a semiconductor device, comprising the steps of:

forming a semiconductor substrate having a doped junction;

forming an insulating layer on the semiconductor substrate;

removing portions of the insulating layer to define a contact hole therethrough;

forming a conductive projected portion on a portion of the doped junction using a photoresist pattern with a width less than a width of the contact hole; and forming a metal layer in the contact hole so that the metal layer contacts the doped junction and the conductive projected portion.

2. The process as claimed in claim 1, wherein said step of forming a conductive projected portion includes the steps of:

depositing a conductive layer on surfaces of the doped junction and the insulating layer, forming a photoresist pattern on the conductive layer, removing portions of the conductive layer using the photoresist pattern to form the conductive projected portion, and removing the photoresist pattern.

3. The process as claimed in claim 2, wherein the conductive layer is deposited with polycrystalline silicon.

4. The process as claimed in claim 1, wherein said step of removing portions of the insulating layer exposes a surface of the doped junction, wherein an unexposed surface of the doped junction contacts the conductive projected portion.

5. The process as claimed in claim 1, further comprising the step of:

forming a metal wiring pattern on the metal layer.

6. The process as claimed in claim 1, wherein the conductive projected portion projects from the doped junction within a middle portion of the contact hole.

7. The process as claimed in claim 1, wherein the conductive projected portion has a cylindrical configuration.

8. The process as claimed in claim 1, wherein the entire conductive projected portion occupies an inner portion of the contact hole.

9. The process as claimed in claim 1, wherein the step of forming a semiconductor substrate includes the step of:

doping an upper surface of the semiconductor substrate with impurity ions.

10. The process as claimed in claim 2, wherein the step of depositing a conductive layer includes the step of:

doping the conductive layer with impurity ions.

11. The process as claimed in claim 2, wherein the step of removing portions of the conductive layer is performed by photoetching the conductive layer using the photoresist pattern as a mask.

12. The process as claimed in claim 1, wherein a bottom surface of the conductive projected portion, which contacts the doped junction, is smaller in size than a top surface of the doped junction.

13. The process as claimed in claim 1, wherein the conductive projected portion contacts the doped junction through an inner portion of the contact hole, whereby a contact area of the metal layer is increased and electrical resistance between the doped junction and the metal layer is reduced.

14. The process of claim 1, wherein the step of forming a metal layer includes the step of:

completely filling the contact hole having the conductive protected portion formed therein with the metal layer.

15. The method as claimed in claim 1, wherein the metal layer is formed in the contact hole and on opposite sides of the conductive projected portion.

16. A method of forming a metal contact of a semiconductor device comprising the steps of:

forming a substrate having a doped junction;

forming an insulating layer pattern on the substrate to define a contact hole;

forming a conductive projection on a portion of the doped junction; and forming a metal layer on opposite sides of the conductive projection so that the metal layer contacts the doped junction and the conductive projection.

17. The method as claimed in claim 16, wherein the conductive projection is formed using a photoresist mask with a width less than a width of the contact hole.

18. The method as claimed in claim 17, wherein the conductive projection is composed of polycrystalline silicon.

19. The method as claimed in claim 16, further comprising the step of:

forming a metal wiring pattern on the metal layer.

20. The method as claimed in claim 16, wherein the conductive projection is doped with a same type of impurity ions as the doped junction.

21. The method as claimed in claim 16, wherein the conductive projection has a substantially cylindrical shape.

22. The process as claimed in claim 10, wherein the conductive layer is doped with a same type of impurity ions present in the doped junction of the semiconductor substrate.

* * * * *